(12) United States Patent
Earls et al.

(10) Patent No.: US 7,327,992 B2
(45) Date of Patent: Feb. 5, 2008

(54) TRACKING GENERATOR WITH INTERNAL VECTOR MODULATION SOURCE

(75) Inventors: Jeffrey D. Earls, Forest Grove, OR (US); Donald J. Dalebroux, Vernonia, OR (US)

(73) Assignee: Tektronix, Inc., Beaverton, OR (US)

( * ) Notice: Subject to any disclaimer, the term of this patent is extended or adjusted under 35 U.S.C. 154(b) by 380 days.

(21) Appl. No.: 10/692,404

(22) Filed: Oct. 22, 2003

(65) Prior Publication Data
US 2005/0090212 A1   Apr. 28, 2005

(51) Int. Cl.
H03J 7/32 (2006.01)
H04B 1/18 (2006.01)
H04B 1/16 (2006.01)

(52) U.S. Cl. ............... 455/148; 455/150.1; 455/177.1; 455/205

(58) Field of Classification Search ............... 455/148, 455/130, 138, 141, 150.1, 164.1, 164.2, 177.1, 455/172.2, 200.1, 205, 208, 220, 255
See application file for complete search history.

(56) References Cited

U.S. PATENT DOCUMENTS

| | | | | |
|---|---|---|---|---|
| 4,627,079 A | * | 12/1986 | von der Embse | 375/343 |
| 4,689,806 A | * | 8/1987 | von der Embse | 375/361 |
| 6,212,566 B1 | * | 4/2001 | Vanhoof et al. | 709/230 |
| 6,834,073 B1 | * | 12/2004 | Miller et al. | 375/130 |
| 6,867,693 B1 | * | 3/2005 | Radin | 340/539.13 |
| 6,967,993 B1 | * | 11/2005 | Miller | 375/150 |
| 2004/0206192 A1 | | 10/2004 | Rieger, et al. | |

* cited by examiner

Primary Examiner—Tony T. Nguyen
(74) Attorney, Agent, or Firm—Francis I. Gray; Michael A. Nelson

(57) ABSTRACT

A tracking generator for an RF measurement instrument having a receiver and a controller includes a vector modulator internal to the tracking generator. The internal vector modulator modulates complex baseband signals based on data from the controller to produce a vector modulation signal. The vector modulation signal is used to modulate a local oscillator frequency from the receiver in an output mixing stage to produce a test signal having an output frequency that matches a measurement frequency to which the receiver is tuned. By controlling the complex baseband data from the controller, an adaptive filter at the output of a DAC that produces an analog signal from the digitally modulated complex baseband data, an internal independent oscillator for the vector modulator, or a large offset phase-locked loop, an offset from the measurement frequency may be generated for the output frequency.

15 Claims, 3 Drawing Sheets

TRACKING GENERATOR WITH INTERNAL VECTOR MODULATION SOURCE

BACKGROUND OF THE INVENTION

The present invention relates to radio frequency (RF) instrumentation, and more particularly to a tracking generator with an internal vector modulation source that is controlled directly by a host RF instrument to perform complex measurements on RF devices.

A tracking generator uses replicas of internal local oscillators of an RF measurement instrument, such as a spectrum analyzer, to create a signal that is at the same frequency that the RF measurement instrument is measuring. The tracking generator is generally provided as an option to the RF measurement instrument. By using the internal local oscillators the tracking generator tunes with a receiver in the RF measurement instrument. In conventional form the tracking generator provides a tuning continuous wave (CW) source that is used to sweep filters, amplifiers and other devices under test (DUTs) as a "poor man's" network analyzer. When used with the tracking generator the RF measurement instrument displays the frequency response of the DUT. FIG. 1 shows how the tracking generator works in conjunction with the receiver and a controller in a representative RF measurement device, where replicas of the internal local oscillators LO1 and LO2 are provided by the receiver to the tracking generator.

Some recent RF measurement instruments have provided an external vector modulation source to generate In-Phase and Quadrature-Phase (I/Q) inputs to the instruments. These allow a user to place an arbitrary modulation on the CW output of the tracking generator. However when using such an external modulator, the RF measurement instruments require re-calibration whenever the external modulator is exchanged or re-cabled. Also the external modulator is not controllable by the RF measurement instrument. Another disadvantage is that equalization of the tracking generator is not possible.

What is desired is improved measurement accuracy when using I/Q modulation of a CW test signal for measuring RF characteristics of a device under test.

BRIEF SUMMARY OF THE INVENTION

Accordingly the present invention provides a tracking generator with an internal vector modulation source that puts modulation directly under the control of a host RF measurement instrument to allow for accurate measurement of complex parameters such as AM/AM and AM/PM conversion in amplifiers as well as load pull tests. The tracking generator has an internal vector modulation source that digitally modulates complex baseband data from a controller of the host RF measurement instrument to produce a baseband modulation signal. The baseband modulation signal is used to modulate a local oscillator frequency from a receiver of the host RF measurement instrument in an output stage to produce an output or test signal having an output frequency that matches a measurement frequency to which the receiver is tuned. By controlling either the complex baseband data from the controller, an adaptive filter at the output of a DAC that produces an analog signal from the digitally modulated complex baseband data, an internal independent oscillator for the vector modulator, or a large offset phase-locked loop at the output stage, an offset from the measurement frequency may be generated for the output frequency ranging from small to large (1 GHz or greater).

The objects, advantages and other novel features of the present invention are apparent from the following detailed description when read in conjunction with the appended claims and attached drawing.

DETAILED DESCRIPTION OF THE INVENTION

Figure 1:
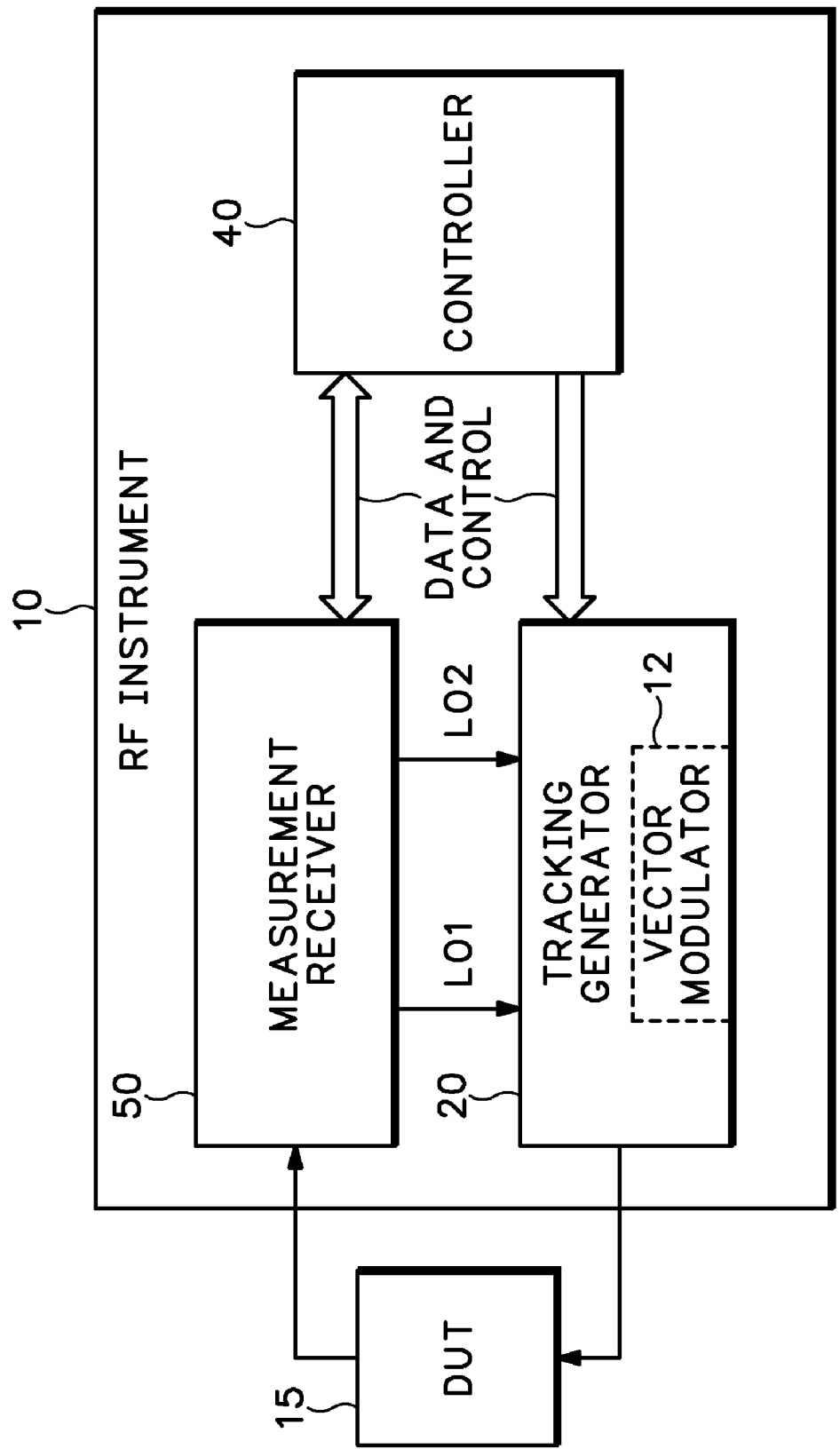
FIG. 1 is a general block diagram view of an RF measurement instrument with a tracking generator including an internal vector modulator according to the present invention.

The present invention integrates an internal vector modulator 12 for the function of generating complex (I/Q) modulation into a tracking generator 20 of a host RF measurement instrument 10, such as a spectrum analyzer. This puts the modulation directly under the control of a controller 40 in the host RF measurement instrument 10. Such control allows for accurate measurement of complex parameters such as AM/AM and AM/PM conversion in amplifiers as well as load pull tests. The tracking generator 20 also may generate two or more tones for inter-modulation tests. Combined with an FFT-based RF measurement instrument 10, inter-modulation measurements are made without sweeping either local oscillator (LO), allowing for a fixed frequency measurement over a limited bandwidth. The tracking generator 20 also may be combined with an offset capability to place realistic digital modulation in one frequency band of a device under test (DUT) 15 while the receiver 50 in the host RF measurement instrument 10 is tuned to measure another band. When combined with an external channel filter, demanding measurements like adjacent channel leakage ratio (ACLR) may be performed. In such a measurement mode if one LO of the receiver 50 should have to change slightly, the vector modulator 12 compensates in frequency within a limited range to keep the modulation at the same absolute frequency. Another advantage to performing the vector modulation internal to the tracking generator 20 is that the system may be calibrated with the internal modulation, or a signal generated by digital-to-analog converters (DACs) may be pre-distorted to compensate for the channel and frequency response of the rest of the tracking generator. This significantly increases the accuracy of any measurements using the internal modulation over the use of external modulation as in the prior art.

Figure 2:
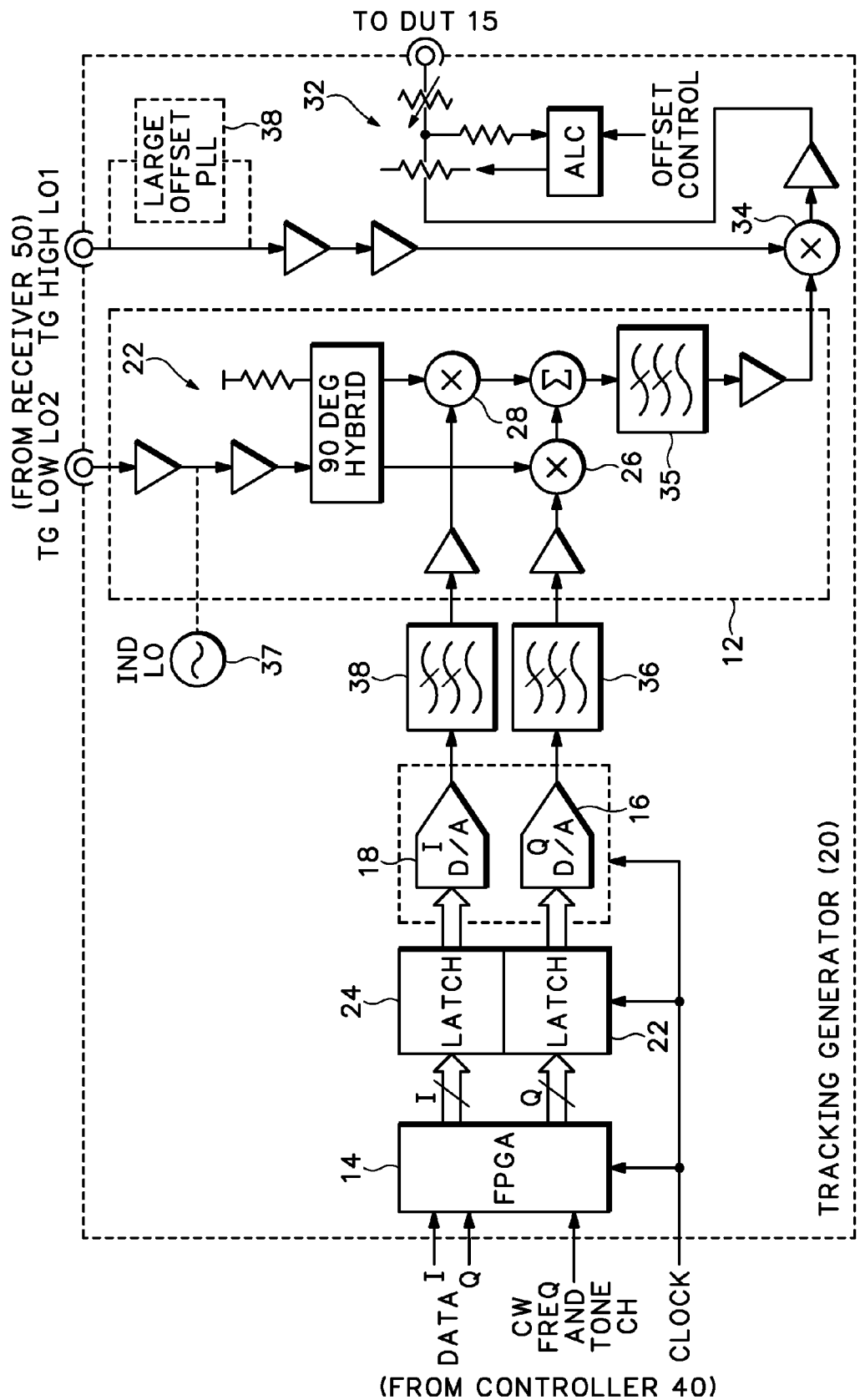
FIG. 2 is a representative circuit diagram view of the tracking generator of FIG. 1 according to the present invention.

Referring now to FIG. 2 one realization of such a tracking generator 20 with an internal vector modulator 12 is shown. Baseband I/Q data is passed from the controller 40 of the RF measurement instrument 10 to a field programmable gate array (FPGA) 14 or similar device for pre-processing, or the FPGA may be commanded to generate the broadband I/Q data from previously stored data. Alternatively the FPGA 14 may be instructed by the controller 40 to create a single or multiple unmodulated tones at specified frequencies. The digital signals from the FPGA 14 are fed into DACs 16, 18 via respective latches 22, 24. The DACs 16, 18 create analog baseband, or near baseband, signals within their Nyquist bandwidth as dictated by a clock rate from the controller 40.

The baseband signals from the DACs 16, 18 is input to the vector modulator 12. The modulator 12 has a pair of mixers 26, 28, one for the in-phase (I) baseband signal and one for the quadrature (Q) baseband signal. The particular embodiment shown here modulates the baseband signals to an intermediate frequency (IF) signal, using a lower frequency local oscillator signal (LO2) from the receiver 50, which corresponds to a first IF of the receiver in the RF measurement instrument 10. An output stage 32 includes a mixer 34 for modulating a higher frequency local oscillator signal (LO1) from the receiver 50 with the IF signal to provide an output or test signal at an output frequency that matches a measurement frequency to which the receiver 50 is tuned.

Figure 3:
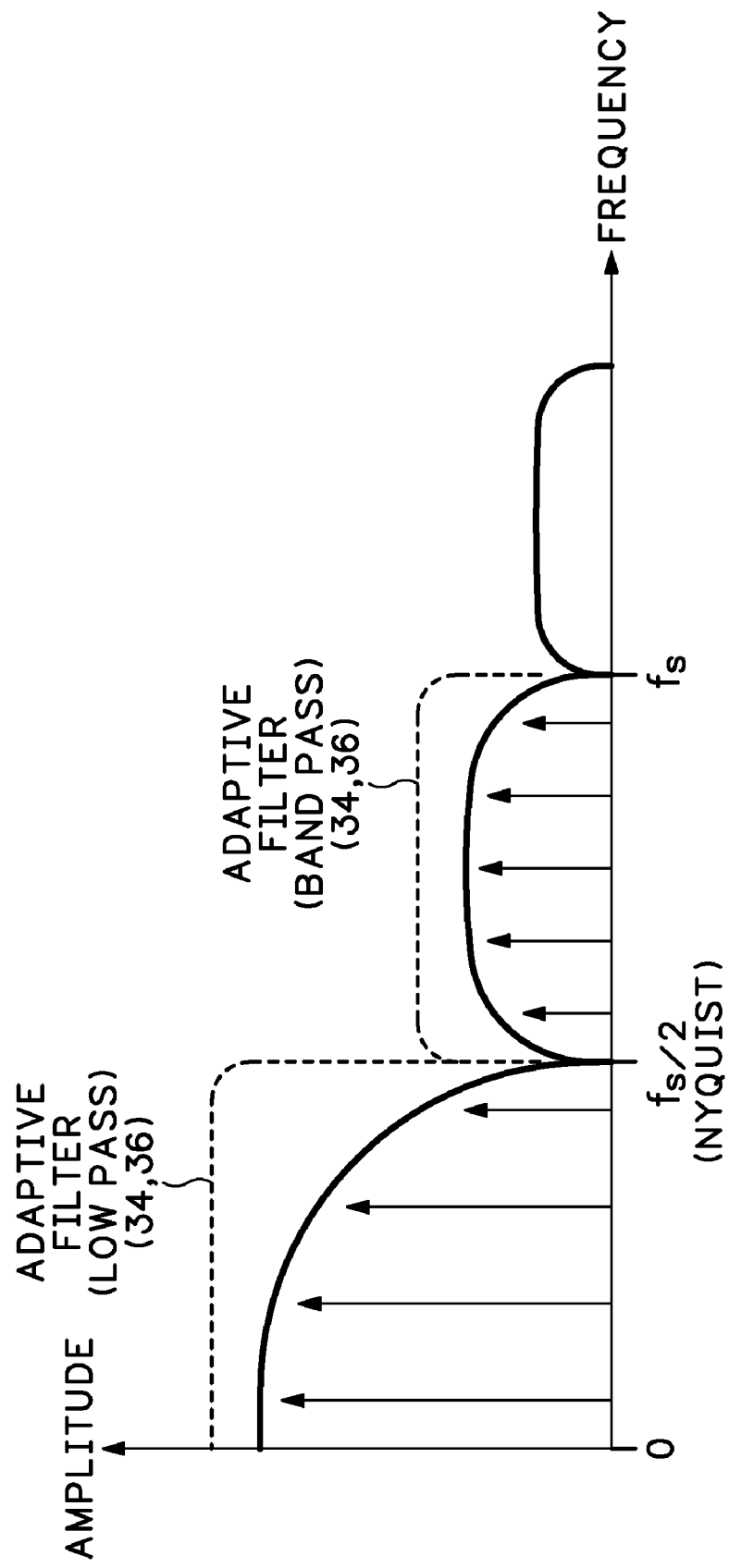
FIG. 3 is a graphic view of a DAC output spectrum illustrating the use of an adaptive filter to select an offset frequency band according to the present invention.

If offset of the output signal from the measurement frequency of the receiver 50 is desired, a small amount may be generated by changing the I/Q inputs to the DACs 16, 18 during pre-processing by the FPGA 14, such as by numerical mixing. Such an offset is desired for communications systems where a base station and hand set communicate with each other at different frequencies. In this way transmitter/receiver band rejection may be measured. If a greater amount of offset is required, the DACs 16, 18 may be operated in a frequency band above their Nyquist band at the expense of more complex, and possibly switched, reconstruction filter requirements. In this case adaptive filters 36, 38 that filter the outputs from the DACs 16, 18 may be operated as bandpass filters rather than lowpass filters to select the frequency band above the Nyquist band—see FIG. 3. An offset phase-locked loop (PLL) 39 may be inserted between LO1 and the input to the output stage mixer 34 to provide even larger frequency offsets by shifting the LO frequency of the tracking generator 20 away from LO1 of the receiver 50. Also an independent oscillator 37 in the vector modulator 12 may be used instead of LO2 from the receiver 50 to provide offset, such offset being limited by the bandwidth of a bandpass filter 35 at the output of the vector modulator—the output signal still tracks LO1 of the receiver 50.

Simpler realizations of the tracking generator 20 may be created. One possibility is to remove one of the DACs 16, 18. In such a realization complex modulations are not generated, but the multi-tone signal may be generated at a lower cost using only the I signal input. Another realization is to use the DACs 16, 18 to create the signals directly at IF and remove one conversion stage if the DACs can operate at high enough sample frequencies or if there is a high enough offset in the offset PLL 39.

As indicated above the calibration of the RF instrument 10, using the output signal from the tracking generator 20 as input to the receiver 50, may be used to generate parameters for the FPGA 14 for pre-distorting the data input to the DACs 16, 18 to compensate for the channel and frequency response of the instrument.

Thus the present invention provides a tracking generator with an internal vector modulation source to provide greater measurement accuracy for an RF measurement instrument, such as a spectrum analyzer.

What is claimed is:

1. A tracking generator for an RF measurement instrument having a controller and a receiver comprising:
   means for generating a baseband signal from baseband data from the controller;
   means for modulating the baseband signal with a modulation oscillator frequency to produce a modulation signal; and
   means for mixing the modulation signal with a local oscillator frequency from the receiver to produce a test signal having an output frequency that matches a measurement frequency for the receiver.

2. The tracking generator as recited in claim 1 further comprising means for offsetting the output frequency from the measurement frequency.

3. The tracking generator as recited in claim 2 wherein the offsetting means comprises means in the generating means for providing an offset in the baseband signal.

4. The tracking generator as recited in claim 2 wherein the offsetting means comprises means for adaptively filtering the baseband signal by lowpass filtering the baseband signal when a small offset in the baseband signal is desired and bandpass filtering the baseband signal in a frequency band above a Nyquist band when a larger offset in the baseband signal is desired.

5. The tracking generator as recited in claim 2 wherein the offsetting means comprises means for adjusting the local oscillator signal prior to input to the mixing means.

6. A tracking generator for an RF measurement instrument having a controller and a receiver comprising:
   means for generating a baseband signal from baseband data from the controller;
   means for modulating the baseband signal with a modulation oscillator frequency to produce a modulation signal;
   means for mixing the modulation signal with a local oscillator frequency from the receiver to produce a test signal having an output frequency that matches a measurement frequency for the receiver; and
   means for offsetting the output frequency from the measurement frequency, the offsetting means comprising means for controlling a modulation oscillator frequency for the modulating means to produce an offset in the modulation signal.

7. The tracking generator as recited in claim 6 wherein the modulation oscillator frequency comprises an intermediate oscillator frequency from the receiver.

8. The tracking generator as recited in claim 6 wherein the modulation oscillator frequency comprises an internal local oscillator frequency.

9. The tracking generator as recited in any of claims 1-6 wherein the generating means comprises:
   means for pre-processing digital data to provide a baseband digital signal in response to control by the controller; and
   means for converting the baseband digital signal to a baseband analog signal as the baseband signal.

10. The tracking generator as recited in claim 9 wherein the baseband signal comprises a complex vector baseband signal having an in-phase and a quadrature-phase component and the modulating means comprises:
    a pair of mixers, each mixer having as inputs respectively one of the in-phase and quadrature-phase components and respectively an in-phase and a quadrature-phase frequency component of the modulation oscillator frequency; and
    means for combining the outputs of the mixers to produce the modulation signal.

11. The tracking generator as recited in claim 10 wherein the in-phase and quadrature-phase frequency components are derived from an intermediate oscillator frequency from the receiver.

12. The tracking generator as recited in claim 9 wherein the baseband signal comprises a tone signal and the modulating means comprises a mixer for mixing the tone signal with the modulation oscillator frequency to produce the modulation signal.

13. The tracking generator as recited in claim 9 wherein the mixing means comprises an output mixer having as inputs the modulation signal and the local oscillator frequency to produce at an output the test signal.

14. A method of producing a test signal from a tracking generator within an RF instrument having a controller and a receiver comprising the steps of:

generating a baseband signal from baseband data from the controller;

modulating the baseband signal with a modulation oscillator frequency to produce a modulation signal; and mixing the modulation signal with a local oscillator signal from the receiver to produce the test signal having an output frequency that matches a measurement frequency for the receiver.

15. The method as recited in claim 14 further comprising the step of offsetting the output frequency from the measurement frequency.

* * * * *